(12) United States Patent
Leycuras

(10) Patent No.: US 6,709,520 B1
(45) Date of Patent: Mar. 23, 2004

(54) REACTOR AND METHOD FOR CHEMICAL VAPOR DEPOSITION

(75) Inventor: André Leycuras, Valbonne (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 0 days.

(21) Appl. No.: 09/601,109

(22) PCT Filed: Nov. 25, 1999

(86) PCT No.: PCT/FR99/02909

§ 371 (c)(1),
(2), (4) Date: Oct. 16, 2000

(87) PCT Pub. No.: WO00/31317

PCT Pub. Date: Jun. 2, 2000

(30) Foreign Application Priority Data

Nov. 25, 1998 (FR) .............................................. 98 14831
May 7, 1999 (FR) .............................................. 99 05840

(51) Int. Cl.⁷ .............................................. C23C 16/00
(52) U.S. Cl. .................. 118/715; 118/724; 118/725
(58) Field of Search .................. 118/715, 724, 118/725; 427/248.1, 255.23, 255.28

(56) References Cited

U.S. PATENT DOCUMENTS

| | | | | |
|---|---|---|---|---|
| 4,315,479 A | * | 2/1982 | Toole et al. | 118/726 |
| 4,533,820 A | * | 8/1985 | Shimizu | 219/411 |
| 4,558,660 A | * | 12/1985 | Nishizawa et al. | 118/725 |
| 4,747,367 A | * | 5/1988 | Posa | 118/715 |
| 5,020,474 A | * | 6/1991 | Tanaka | 118/725 |
| 5,108,792 A | * | 4/1992 | Anderson et al. | 427/248.1 |
| 5,194,401 A | * | 3/1993 | Adams et al. | 438/765 |
| 5,253,324 A | * | 10/1993 | Wortman et al. | 392/416 |
| 5,336,324 A | * | 8/1994 | Stall et al. | 118/724 |
| 5,443,648 A | * | 8/1995 | Ohkase | 118/724 |
| 5,695,567 A | * | 12/1997 | Kordina et al. | 118/725 |
| 5,749,974 A | * | 5/1998 | Habuka et al. | 118/725 |
| 5,819,684 A | * | 10/1998 | Hawkins et al. | 118/715 |
| 5,879,459 A | * | 3/1999 | Gadgil et al. | 118/715 |
| 6,002,109 A | * | 12/1999 | Johnsgard et al. | 219/390 |
| 6,121,061 A | * | 9/2000 | Van Bilsen et al. | 438/14 |
| 6,133,550 A | * | 10/2000 | Griffiths et al. | 219/403 |
| 6,303,906 B1 | * | 10/2001 | Yoo | 219/390 |

* cited by examiner

*Primary Examiner*—Jeffrie R. Lund
(74) *Attorney, Agent, or Firm*—Blakely, Sokoloff, Taylor & Zafman

(57) ABSTRACT

The process for chemical vapor deposition of layers of material on a substrate which extend generally in a plane is disclosed. The process for depositing thin film materials on the substrate is made more economical by virtue of a better energy balance than previously disclosed. The substrate is heated by radiation from the heat of a duct but also by the gases passing over the substrate which themselves are heated by the duct. The heating of the gases further improves the coupling between the heating means and the substrate.

21 Claims, 3 Drawing Sheets

FIG_4

REACTOR AND METHOD FOR CHEMICAL VAPOR DEPOSITION

The invention relates to the field of fabricating layers of materials on a substrate. More specifically, it relates to a process for the chemical vapor deposition of materials on a substrate in order to make layers, possibly monocrystalline layers. The invention also relates to a reactor for implementing this process.

Many devices are already known for depositing layers on substrates by so-called CVD (Chemical Vapor Deposition) or MOCVD (Metal Organic Chemical Vapor Deposition, i.e. when one or more precursors are present in the form of organometallic compounds) methods.

To obtain layers of material with a quality high enough for the applications for which they are intended, it is necessary to heat the substrate on which they are deposited. Generally, the substrate is heated by thermal conduction between it and a substrate holder, sometimes also called a susceptor, which is itself heated by induction, by resistance heating or by radiation generated by lamps.

For example, PCT International Application WO 96/23912 teaches a reactor for the epitaxial growth of silicon carbide by a CVD method. This reactor comprises an external chamber and an internal duct. The carrier gases and the growth gases flow into the internal duct but can also communicate with the space lying between the internal duct and the external chamber. In such a reactor, the substrate on which the layers have to be deposited is placed in the gas stream, in the internal duct. This substrate is heated by heating means comprising a susceptor and a coil. The susceptor is placed beneath that region of the internal duct in which the substrate is located during the deposition. The susceptor is near the internal duct or in contact with it. The susceptor may even form part of the wall of the duct, in this region. The coil generates a radiofrequency field in the region of the susceptor so that the susceptor, when excited by this radiofrequency field, produces heat.

Also known, from the document Patent Abstract of Japan, Vol. 7, No. 251, is a reactor for vapor deposition of layers of a material on a substrate which extends mainly in a plane, comprising first and second heating means consisting of lamps and located outside a quartz duct, on either side of the substrate which is located in the duct.

However, on the one hand, the energy balance of this mode of heating, like that by radiation, is particularly poor because of poor coupling between generator (coils or lamps) and susceptor.

Sometimes the energy balance is worsened further when a quartz tube, in which the substrate holder is confined, is used for channeling the gases and when the tube is a double-walled tube in order to allow water circulation for cooling the tube. However, this further limits the coupling between the induction coil and the susceptor.

Thus, in order to deposit layers using this type of reactor, at temperatures which are sometimes greater than 1500° C., it is necessary to supply it with a power often greater than 10 kilowatts, for a reactor with a capacity for a substrate 50 mm in diameter. In addition, the induction heating requires expensive investments because of this technology and of the necessary oversizing when high-frequency generators are used.

On the other hand, the energy balance may be just as poor, whatever the mode of heating, because of poor thermal coupling between the substrate holder and the substrate. This is because, when the substrate is simply placed on the substrate holder, the heat exchange takes place poorly, by solid conduction, very little, or even hardly at all, by gaseous conduction, most especially if the gas pressure is very low, and also very little by radiation, if the substrate is transparent in the radiation range of the susceptor. There are solutions for alleviating these problems, such as by adhesively bonding the substrate to the substrate holder or by depositing an -absorbent layer behind the substrate. However, these solutions require undesirable additional preparation steps; the materials for the adhesive bonding or those for being deposited on the rear face may contaminate the deposition reactors and the layers produced in these reactors; sometimes even, these solutions are ineffective for high-temperature heating.

One objective of the invention is to provide a process for depositing thin-film materials on a substrate, which is more economical, especially by virtue of a better energy balance than that allowed by the devices of the prior art.

This object is achieved by virtue of the invention which, in one of its aspects, is a process for the vapor deposition of layers of a material on a substrate which extends generally in a plane, characterized in that it comprises:
  a step consisting in placing the substrate in a duct made of a refractory material and swept by the gaseous compounds necessary for the deposition, this duct being interposed between the substrate and first and second heating means located on either side of the plane of the substrate and
  a step consisting in heating the substrate by virtue of the radiation from the heat of the duct, which is itself heated by the first and second heating means.

Thus, by virtue of the process according to the invention, the two main faces of a generally plane substrate are heated. The heating of the deposition face by the second means makes it possible to compensate for the radiative thermal losses from this face. Consequently, the temperature desired for this face is reached by heating the opposite face less, by the first heating means. In this way, it is possible to consume a smaller amount of power in the first heating means. Overall, this reduced power is not offset by the consumption of the second heating means. The deposition process according to the invention is therefore more economical than the deposition processes already known.

Furthermore, since the substrate is placed in a duct swept by the gaseous compounds necessary for the deposition, the duct being interposed between the substrate and the first and second heating means, the substrate is heated by the radiation from the heat of the duct, which is itself heated by the heating means located near the latter, but also by the gases which are themselves heated by the duct. This further improves the coupling between the heating means and the substrate. In addition, the duct channels the gas streams, thereby limiting any turbulence liable to disturb the growth of the layers of material on their substrate.

Advantageously, the process according to the invention comprises a step consisting in placing at least one heat shield around the first and second heating means.

Also advantageously, the process according to the invention comprises a step consisting in generating a temperature gradient perpendicular to the plane of the substrate and oriented in a first direction. The process according to the invention may even comprise a step consisting in reversing the direction of the temperature gradient with respect to the first direction. The fact of being able to choose and modify the direction of the gradient is a very advantageous option in the process according to the invention.

According to another aspect, the invention is a reactor for the vapor deposition of layers of a material on a substrate, which extends mainly in a plane, comprising first and second heating means located on either side of the plane of the substrate, characterized in that it furthermore comprises a duct, made of a refractory material and swept by the gaseous compounds necessary for the deposition, this duct being interposed between the substrate and first and second heating means. Advantageously, the reactor according to the invention comprises at least one heat shield around the first and second heating means.

Further aspects, advantages and objectives of the invention will appear on reading the detailed description which follows. The invention will also be more clearly understood with the aid of the reference numbers in the drawings, in which.

Figure 1:
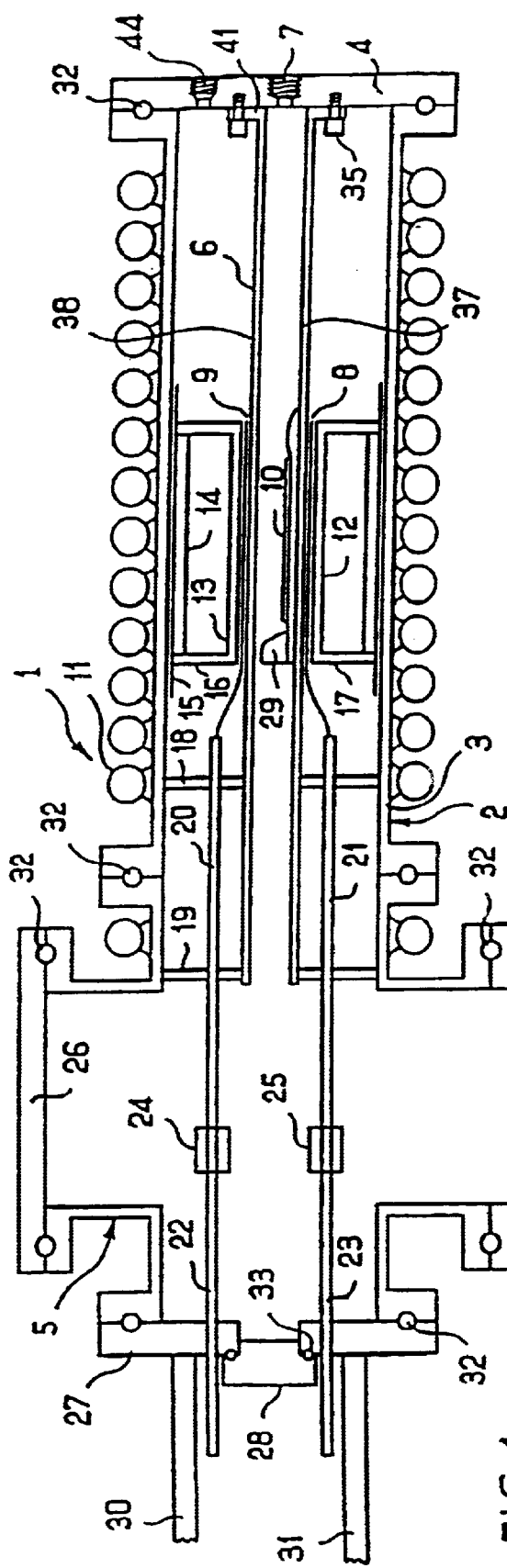
FIG. 1 is a schematic illustration, in longitudinal mid-section, of one example of a reactor according to the present invention.

A nonlimiting example of a reactor according to the invention is illustrated in FIG. 1. This reactor 1 comprises a chamber 2 consisting of a tube 3, a first closure plate 4, located at one of the ends of this tube 3, and an outlet cross 5 located at the opposite end of the tube 3 with respect to the first closure plate 4. The entire reactor 1 is sealed and can possibly withstand a pressure of a few MPa. The sealing of the reactor 1 is provided by seals 32, 33.

The outlet cross 5 may be replaced by a "T"-shaped element.

The axis of the tube 3 is in the horizontal. Placed inside the tube 3, coaxial with it, is a duct 6. Placed outside the tube 3 are cooling means 11 capable of cooling the tube 3. The tube 3 is advantageously a cylinder made of stainless steel.

The cross 5 is preferably fixed since one of its outlets is connected to the pumping system.

The outlet cross 5 has a lower orifice and an upper orifice, these being radially opposed in the vertical direction. The lower orifice of this outlet cross 5 emerges either on a pump and a pressure regulator for low pressures or on a pressure-release valve for a pressure greater than atmospheric pressure, so as to discharge the gases at constant pressure. These apparatuses are not illustrated in FIG. 1. The upper orifice of the outlet cross 5 is hermetically closed off by a second closure plate 26. The outlet cross 5 also possesses an orifice longitudinally opposed to the tube 3. This orifice may optionally be provided with a rotating passage. In the embodiment presented here, this orifice is closed off by a third closure plate 27 perpendicular to the axis of the tube 3. The third closure plate 27 may optionally be equipped with a window or with a moveable mirror for optical measurements inside the duct 6. This third closure plate 27 includes a hermetically sealed port 28 allowing substrates 10 to be introduced into or extracted from the reactor 1. The third closure plate 27 also includes guides 30, 31. These guides 30, 31 are perpendicular to the plane of the closure plate 27 and are solidly fastened to it. These guides 30, 31 serve for horizontally guiding a manipulator, not illustrated in the figures. The third closure plate 27 also includes passages for first current leads 22, 23. Those parts of the first current leads 22, 23 which are located toward the inside of the chamber 2 are provided with connectors 24, 25.

The duct 6 is positioned and held in place in the tube 3 by virtue of means 35 for fastening the duct 6 to the first closure plate 4. Thus, the duct 6 is held in place so as to be free of any contact with the tube 3. This makes it possible to limit the thermal conduction losses and to avoid thermal stresses.

Figure 2:
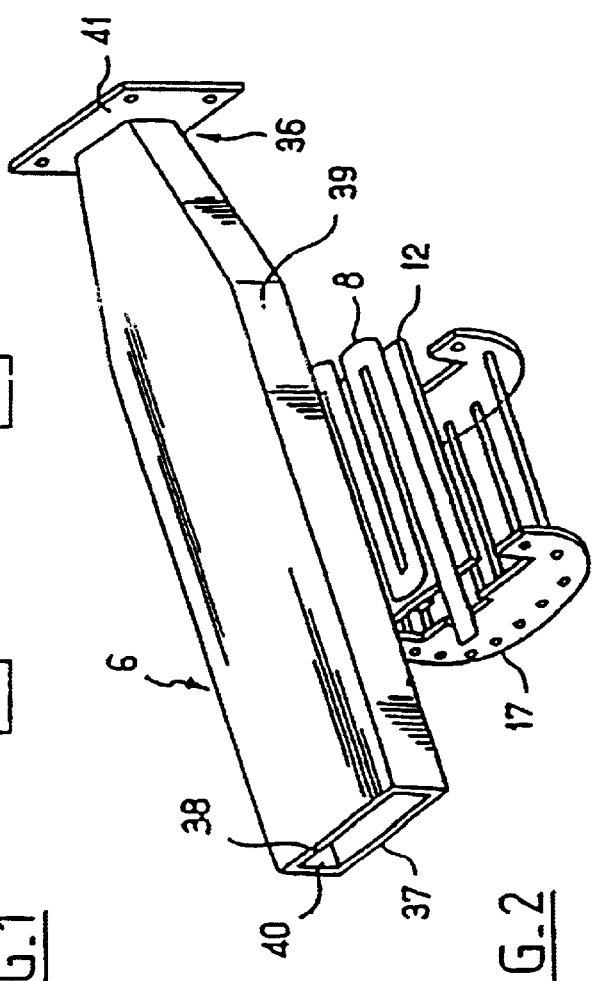
FIG. 2 is an exploded perspective illustration of the arrangement of the first heating means and of the duct, these being used in the construction of the reactor illustrated in FIG. 1.

As illustrated in FIG. 2, the duct 6 is in the form of a tube with a rectangular cross section, having a narrowing 36 at one end of it. This duct 6 comprises two plates for forming lower 37 and upper 38 walls. The lower 37 and upper 38 walls of the duct 6 are horizontal and parallel to the plane of the substrate 10 in the position that it occupies during the deposition. Side walls 39, 40 join the longitudinal edges of the lower 37 and upper 38 walls in order to close the duct 6 longitudinally. That end of the duct 6 which is located on the same side as the narrowing 36 has a square cross section. It is provided with a support plate 41 perpendicular to the longitudinal axis of the duct 6. This support plate 41 has an opening facing the mouth of the duct 6, located on the same side as the narrowing 36. The support plate 41 also has holes in order to allow the duct 6 to be fastened to the first closure plate 4, using the fastening means 35. When the duct 6 is fastened to the first closure plate 4, the mouth of the duct 6, located on the same side as the narrowing 36, and the opening in the support plate 41 lie facing a gas inlet 7. The duct 6 is connected in a sealed manner to the first closure plate 4 at the gas inlet 7. The joint between the duct 6 and the first closure plate 4 is sealed by tightening a graphite seal for example, using the fastening means 35.

The gas inlet 7 serves for supplying the reactor 1 with carrier and precursor gases. The first closure plate 4 is also provided with a gas passage 44 which is offset with respect to the axis of symmetry perpendicular to the plane of the disk formed by the first closure plate 4 and which emerges between the duct 6 and the wall of the tube 3. The gas passage 44 also allows the introduction of gas into the reactor 1. The gas passage 44 allows the flow of a gas which is inert with respect to all of the materials included in the reactor 1 and with respect to the material to be deposited and to the gases flowing in the duct 6, this inert gas preventing any return of the gases resulting from the process toward the heating parts external to the duct 6.

Preferably, the duct 6 is in a material which, all at the same time, is a good heat conductor, is a good electrical insulator, is highly refractory, is chemically very stable and has a low vapor pressure at the operating temperatures, although, optionally, a prior coating of the material intended to be deposited on a substrate 10 in this reactor 1 can be deposited on the internal face of the walls 37, 38, 39, 40 of the duct 6 so as to minimize the diffusion of any outgasing substances during the normal operation of the reactor 1.

Also advantageously, this material has good mechanical strength in order to allow the walls 37, 38, 39. 40 of the duct 6 to have a small thickness. The small thickness of these walls 37, 38, 39, 40 makes it possible to minimize the thermal conduction losses.

The mechanical strength of the material of the duct is also important in being able to support this duct 6 only by its end located on the same side as the narrowing 36 and the support plate 41.

The constituent material of the duct 6 is advantageously boron nitride for use at temperatures of less than 1200° C., or at higher temperatures if the presence of a high nitrogen concentration does not impair the expected quality of the material produced.

For higher temperatures, the duct 6 may be made of graphite. In one case, just as in the other, the duct 6 may be internally lined in the hottest parts with a secondary duct made of a refractory material, for example a refractory metal, which is inert with respect to the gases flowing in the duct 6 and is noncontaminating with respect to the material deposited. The duct 6, whether made of graphite or boron nitride, may be produced either by pyrolitic deposition, or by assembling and/or adhesively bonding the various constituent plates of the walls 37, 38, 39, 40 and the support plate 41. This secondary duct, when there is one, advantageously lines the inside of the duct 6 in a continuous manner, that is to say that, if it consists of plates, these are contiguous and there are no holes in these plates. The secondary duct is, for example, made of tungsten, tantalum, molybdenum, graphite or boron nitride.

By way of example, the thickness of the walls of the duct 6 is less than or equal to approximately 1 mm; the internal height of the duct 6 is preferably less than 30 mm; the width of the duct 6 is equal to the width of a substrate 10 or to the sum of the widths of the substrates 10 which are treated during the same deposition, plus approximately 1 cm between the substrate or substrates 10 and the walls 39 and 40.

That part of the duct 6 corresponding to the narrowing 36 corresponds to about ⅕ of the total length of the duct 6. The length of the part with a constant cross section of the duct 6 is equal to approximately five times the diameter or the length of the largest substrate 10 which it is desired to use or five times the sum of the diameters or lengths of the substrates 10 on which a deposition may be carried out during the same operation. That part of the duct 6 which extends over a length corresponding to the diameter or to the length of a substrate, or to the sum of the lengths or the diameters of the substrates, is called hereafter the deposition zone.

Advantageously, the reactor 1 is provided with first 8 and second 9 heating means placed near the deposition zone and located on either side of the plane of the substrate 10.

Advantageously, these first 8 and second 9 heating means consist of bare resistive elements, i.e. the constituent material of the first 8 and second 9 heating means is in direct contact with the gas flowing between the duct 6 and the tube 3.

Each resistive element corresponding respectively to the first 8 or to the second 9 heating means consists of a band, i.e. a rigid plate element, or of a strip, which is placed flat and parallel to the lower 37 and upper 38 walls of the duct 6 (FIG. 2). This strip or band has a suitable geometry so that, in the deposition zone, the deviations from the mean temperature on that surface of the substrate 10 which is intended for the deposition are minimized. More preferably, these deviations are less than 3° C. Preferably, each resistive element has a dimension in the direction parallel to the width of the duct 6 which is approximately equal to this width. The dimension of each resistive element in the direction parallel to the length of the duct 6 is approximately equal to twice the length of the deposition zone. This in order to optimize the uniformity of the temperature field in the deposition zone. Preferably, each band or strip of a resistive element consists of bands parallel to one another in the longitudinal direction of the tube 3, these bands joining each other in pairs alternately at one or other of their ends so as to form a zigzag geometry. Other geometries can be envisaged, such as spiral geometries.

Each resistive element may have a longitudinal resistance profile, for example obtained by varying its thickness, the profile being suitable for favoring the formation of a controlled temperature profile in the deposition zone.

Each resistive element has a high filling coefficient in the deposition zone so that their temperature remains as little as possible above the desired local temperature.

The space between the bands of the resistive elements is sufficient to avoid an arc or a short circuit, but is also small enough to maintain acceptable homogeneity in the temperature field and for it not to be necessary for its temperature to be much higher than that of the duct which is itself that at which the deposition takes place. Preferably, the first 8 and second 9 heating means are supplied with a voltage of less than or equal to 240 volts and more preferably still of less than or equal to 100 or 110 volts.

Optionally, the first heating means 8 and second heating means 9 each consist of several resistive elements of the type of those described above.

Advantageously, the resistive elements are made in an electrically conducting and refractory material having a very low vapor pressure at the operating temperatures. This material may, for example, be graphite, a metal such as tantalum or tungsten, or else a refractory alloy, etc. Preferably, it is high-purity graphite.

The first 8 and second 9 heating means are supplied with current independently of each other so as to be able to be raised to different temperatures. It is also possible to generate a temperature gradient perpendicular to the plane of the substrate 10. This gradient may have a positive, negative or zero value, by independently controlling the electrical power applied to one of the first 8 or second 9 heating means.

The first 8 or second 9 heating means may be applied, outside the duct 6, in the region of the deposition zone, so that they are in contact with the lower 37 and upper 38 walls, respectively. However, according to a variant, these means are each positioned, outside the duct 6, so as to be a distance of 1 to 3 mm from one of the lower 37 or upper 38 walls, respectively. The first 8 and second 9 heating means are each pressed against the lower 37 and upper 38 walls by retention plates 12, 13 which are electrically insulating and thermally conducting. If the duct 6 is not an electrically insulating material, it is necessary to put, between the duct 6 and the first 8 and second 9 heating means, an electrically insulating intermediate material in order to avoid any electrical contact, especially in the hot zone, if very high temperatures have to be achieved.

These retention plates 12, 13 may be made of boron nitride and have a thickness of approximately 1 mm, or even less. It is also particularly advantageous to confine the retention plates 12, 13 to the coolest ends of the elements of the duct 6 so as to prevent decomposition of the boron nitride and formation of nitrogen. Boron nitride sheaths designed to house thermocouples 51 may be cemented to the retention plates 12, 13, but they may also be free above the first 8 and second 9 heating means.

These thermocouples 51 (not shown in FIGS. 1 to 3) are used for measuring the temperature of the duct 6, to regulate it and to control the homogeneity of the duct in the deposition zone. They can be used for temperatures of less than 1700° C. (for temperatures greater than 1700° C., the temperature must be measured by optical pyrometry or by thermocouples without any contacts). The hot junction of these thermocouples 51 is located outside the duct 6 as close as possible to the first 8 and second 9 heating means.

As shown in FIG. 2, the first 8 and second 9 heating means, as well as the retention plates 12, 13, are held together against the duct 6 by means of cradles 16, 17. Each cradle 16, 17 consists of two half-disks which are parallel to each other and connected together by rods which are perpendicular to them. The diameter of the disks, consisting of two half-disks, is slightly less than the internal diameter of the tube 3. The straight edge of the two half-disks is in a horizontal plane. Each straight edge of each half-disk includes notches capable of receiving a retention plate 12 or 13, the first 8 or second 9 heating means as well as half the height of the duct 6. The resistive elements of the first 8 and second 9 heating means are kept isolated from the duct 6 by the cradles 16, 17.

When the duct 6 is made of graphite, that is to say when it is conducting, the first 8 and second 9 heating means may be made of rigid graphite. They are then electrically isolated from the duct 6 by spacers, for example made of boron nitride, which separate them from the duct 6 by a few millimeters. These spacers may be fastened to the ends of the first 8 and second 9 heating means and therefore may not be heated excessively. One or more sheaths, made of graphite or of boron nitride, may be fastened to the faces of the duct 6 in order to house thermocouples which are themselves insulated in refractory and electrically insulating sheaths.

The dimension of these cradles 16, 17 in the direction parallel to the longitudinal axis of the duct 6 corresponds approximately to the length of the first 8 or second 9 heating means in that direction.

These cradles 16, 17 are placed approximately in the middle of the duct 6, considered along its longitudinal direction.

Advantageously, the half-disks of the cradles 16, 17 are in contact with the duct 6 in the cool parts of the latter.

Heat shields 14, 15 are placed on either side of the first 8 and second 9 heating means, outside the latter. More specifically, heat shields 15 are located between the internal wall of the tube 3 and the curvilinear part of the half-disks making up the cradles 16, 17. They extend below the internal face of the tube 3, but without contacting the latter, concentrically around the heating zone. Other heat shields 14 are placed between the retention plates 12, 13 and the previous heat shields 15. These heat shields 14, 15 are composed of two or three thin sheets of polished, reflecting and refractory metal such as tantalum, molybdenum, etc. The outermost heat shield 14 or 15 is at the closest point a few millimeters from the internal wall of the tube 3. This longitudinal configuration, with the first 8 and second 9 heating means inside the tube 3, in contact with the duct 6, and two or three heat shields 14, 15, greatly limits the radiation losses which would otherwise be very considerable at high temperatures, such as those required for the deposition of silicon carbide.

The half-disks of the cradles 16, 17 are made in an electrically and thermally insulating material. Thus, the heat shields 14, 15 are electrically and thermally insulated from each other and from the heating means 8, 9.

The assembly consisting of the duct 6, the first 8 and second 9 heating means, the retention plates 12, 13, the cradles 16, 17 which hold all these elements together, together with the heat shields 14, 15, is placed in the tube 3. This assembly limits the flow of gas outside the hot part of the duct and thus helps to limit the heat losses.

Advantageously, two disks 18, 19 are placed, perpendicular to the axis of the tube 3, between the cradles 16, 17 and the outlet cross 5.

Figure 3:
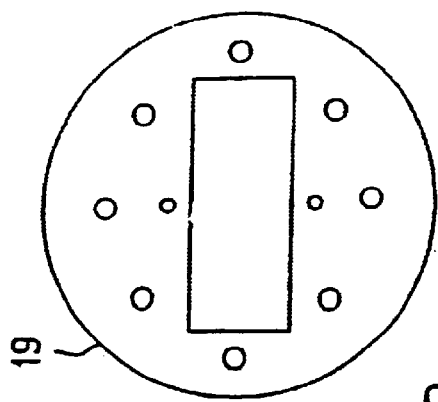
FIG. 3 is a front top view of a component allowing the duct to be held in place inside the chamber of the reactor illustrated in FIG. 1.

As shown in FIG. 3, these disks 18, 19 are provided with a rectangular central opening, the area of which corresponds approximately to the cross section [lacuna] the duct 6, so as to be able to slip these disks 18, 19 onto the duct 6. These disks 18, 19 also have holes peripheral to the central opening and intended for passage of second current leads 20, 21 and thermocouple wires 51. One 19 of these disks 18, 19 is placed in the outlet cross 5. The other 18 of these disks 18, 19 is placed between the disk 19 and the cradles 16, 17. The purpose of these disks 18, 19 is to hold together the duct 6, the second current leads 20, 21 and the wires of the thermocouples 51, as well as to limit the gas exchange between the inside of the duct 6 and the space lying between the duct 6 and the tube 3. However, the disks 18, 19 must allow passage of the gases coming from the outlet of the duct 6, between the internal space of the duct 6 and the space lying between the duct 6 and the tube 3, so that the pressure is balanced on either side of the walls 37, 38, 39, 40. By thus balancing the pressure on either side of the walls 37, 38, 39, 40, it is possible to make the latter with a small thickness.

The pairs of second current leads 20, 21 are connected to the first current leads 22, 23 by means of connectors 24, 25. The thermocouples 51 are also connected to the outside of the chamber 2 via connectors located in the chamber 2.

The disks 18, 19 may be made of an electrically and thermally insulating, but not necessarily highly refractory material.

The hermetically sealed port 28 covers an opening whose width is approximately equal to that of the duct. This opening is located on the axis of the duct 6. It allows the substrates 10 to be inserted and removed. An inlet airlock is possibly connected to the third closure plate 27 in order to prevent, during the operations of inserting and removing the substrates 10, from venting the reactor 1 to atmosphere again.

The substrates 10 are advantageously inserted into the reactor 1 by means of a substrate holder 29. Advantageously, the substrate holder 29 is made of a material which is a good thermal conductor so that it has little thermal inertia. Preferably, this substrate holder 29 is made of boron nitride, but it may also be made of graphite for example. The substrate holder 29 is inserted into the reactor 1 by a gripper manipulator which slides along the guides 30, 31. This manipulator consists of a thin rigid tube coaxial with the axis of the duct 6, of a long rod threaded on the inside of this tube and fastened, on the reactor 1 side, to two symmetrical gripper elements which are hinged about a vertical hinge, the outer end of the threaded rod being screwed by a freely rotating captive nut. By screwing the nut, the threaded rod retracts and the gripper is thermally clamped onto a vertical part of the substrate holder 29. The manipulator can then be moved along the guides 30, 31 in order to insert or remove the substrate holder 29. A cam on the manipulator may be provided in order to allow the gripper to be raised, when the latter has just seized the substrate holder 29, in its position inside the duct 6, so that the latter does not rub against the internal face of the wall 37.

Before commissioning the reactor 1, a coating of the predominant product to which the reactor 1 is dedicated is deposited in the duct 6, with neither the substrate 10 nor the substrate holder 29, after a thorough degassing step, at a temperature greater than the usual deposition temperature, and a thorough purge with the carrier gas. This step may be followed by a similar deposition on the substrate carrier 29, without the substrate 10. The reactor is then ready to be used.

Many variants of the process and the reactor according to the invention are possible.

Described above were resistive first 8 and second 9 heating means. This type of heating means makes it possible to reach temperatures greater than 1750° C. with a low investment in terms of materials and a lower energy consumption than with the processes and the reactors of the prior art. However, other types of heating means 8, 9 may be envisaged, even if they seem less advantageous, such as induction heating means, heating means in which the first 8 and second 9 heating means form only a single device placed all around the duct 6, etc.

Figure 4:
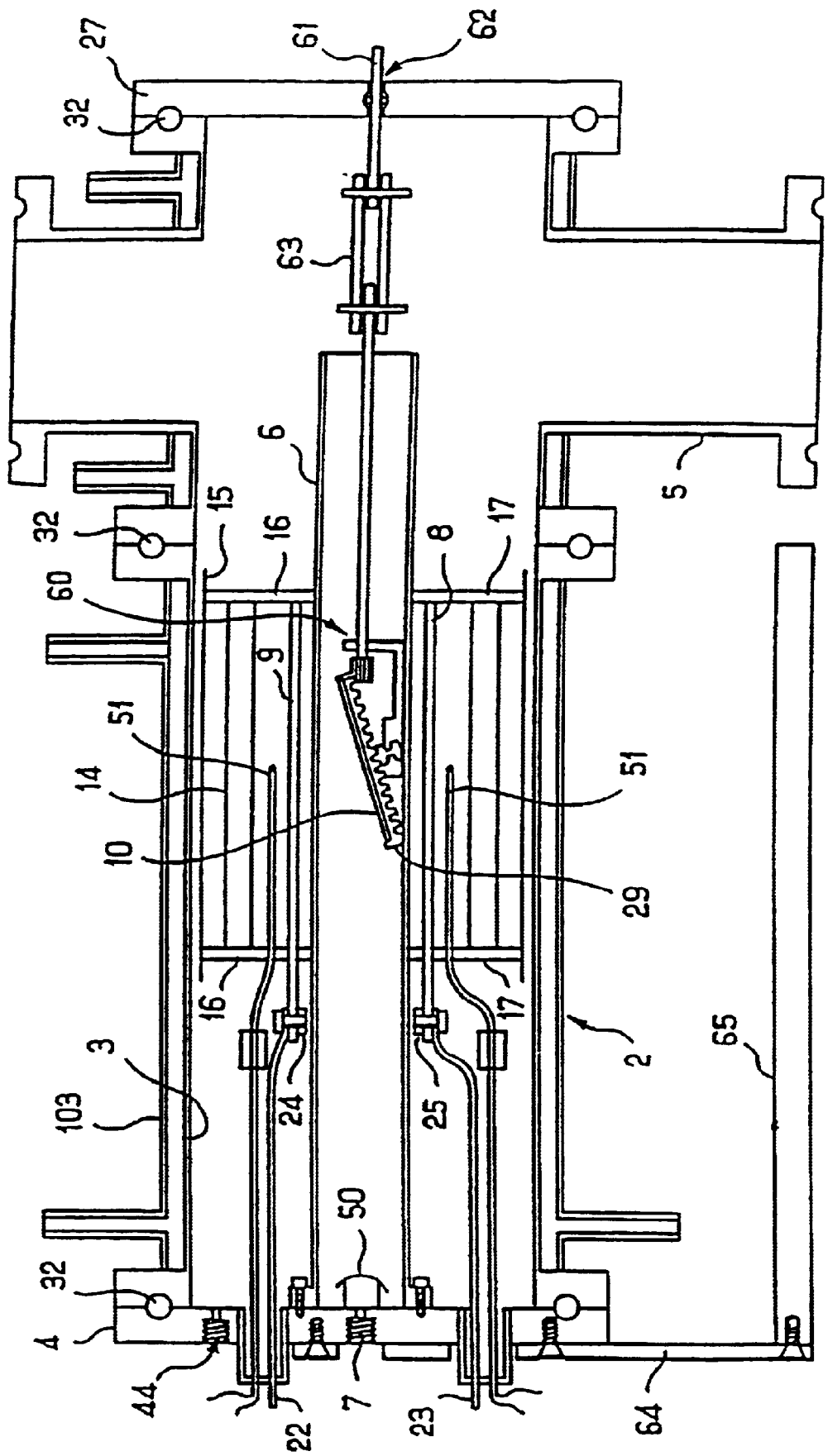
FIG. 4 is a schematic illustration, in longitudinal mid-section, of another example of a reactor according to the present invention.

FIG. 4 shows another embodiment of the reactor 1 according to the invention. In this embodiment, the reactor 1 comprises a chamber 2 consisting of two concentric stainless steel tubes 3, 103, the common axis of revolution of which is horizontal. A coolant flows in the space between the two walls of these tubes 3, 103.

An antisplash nozzle 50 is mounted on the axis of the gas inlet 7 so as to be conducive to achieving good gas velocity uniformity. The gas passage 44 may also optionally be provided with an antisplash nozzle.

A mechanism 60, driven by a shaft 61 which passes through a gastight penetration 62, and a sliding coupling 63, allows the substrate 10 to be rotated so as to ensure greater uniformity of the deposition.

All the electrical and fluid connections to the third closure plate 27 and the first closure plate 4 are sufficiently long and flexible to be able to move them over approximately twice the length of the duct 6. Advantageously, the connections may also be made only to the first closure plate 4.

The first closure plate 4 is fastened to a carriage comprising a vertical support 64 and a horizontal support 65.

The horizontal support 65 may be moved parallel to the axis of the tube 3 over a running track, not shown. In order to mount the assembly comprising the duct 6 and its equipment, the first closure plate 4 is a opened, the tube 3 remaining fastened to the cross 5.

To load or unload a substrate 10 there is the choice between opening the third closure plate 27 or separating the tube 3 from the cross 5.

The substrates 10 are inserted and held in place in the deposition zone by a graphite substrate holder 29 which may be raised a few degrees, on the downstream side with respect to the gas flow, so as to offer a greater area of projection on a vertical plane, in the duct 6. The substrate holder consists, for example, of a disk with a rim. Advantageously, the rim has a height greater than the height of the substrate 10. The substrate holder 29 can rotate the substrate 10 which it supports, so as to ensure better deposition uniformity. Advantageously, this is achieved by virtue of a mechanical transmission consisting of a bevel gear having a horizontal axis and fastened to the shaft 61, the latter being rotated by a motor external to the reactor 1, at a variable speed, providing a substrate rotation speed possibly ranging up to 10 revolutions per second.

According to an advantageous variant, not shown, of the reactor according to the present invention, the reactor has first 8 and second 9 heating means which are offset one with respect to the other in the longitudinal direction of the duct 6. This also makes it possible for the temperature distribution to be made uniform over the entire surface area of the substrate, favoring the formation of a plateau in the longitudinal temperature profile.

According to another advantageous variant, the center of the substrate 10 on the substrate holder 29 is shifted toward the downstream direction of the gas flow, in the zone of the first 8 and second 9 heating means, without nevertheless the substrate 10 leaving this zone.

Figure 5:
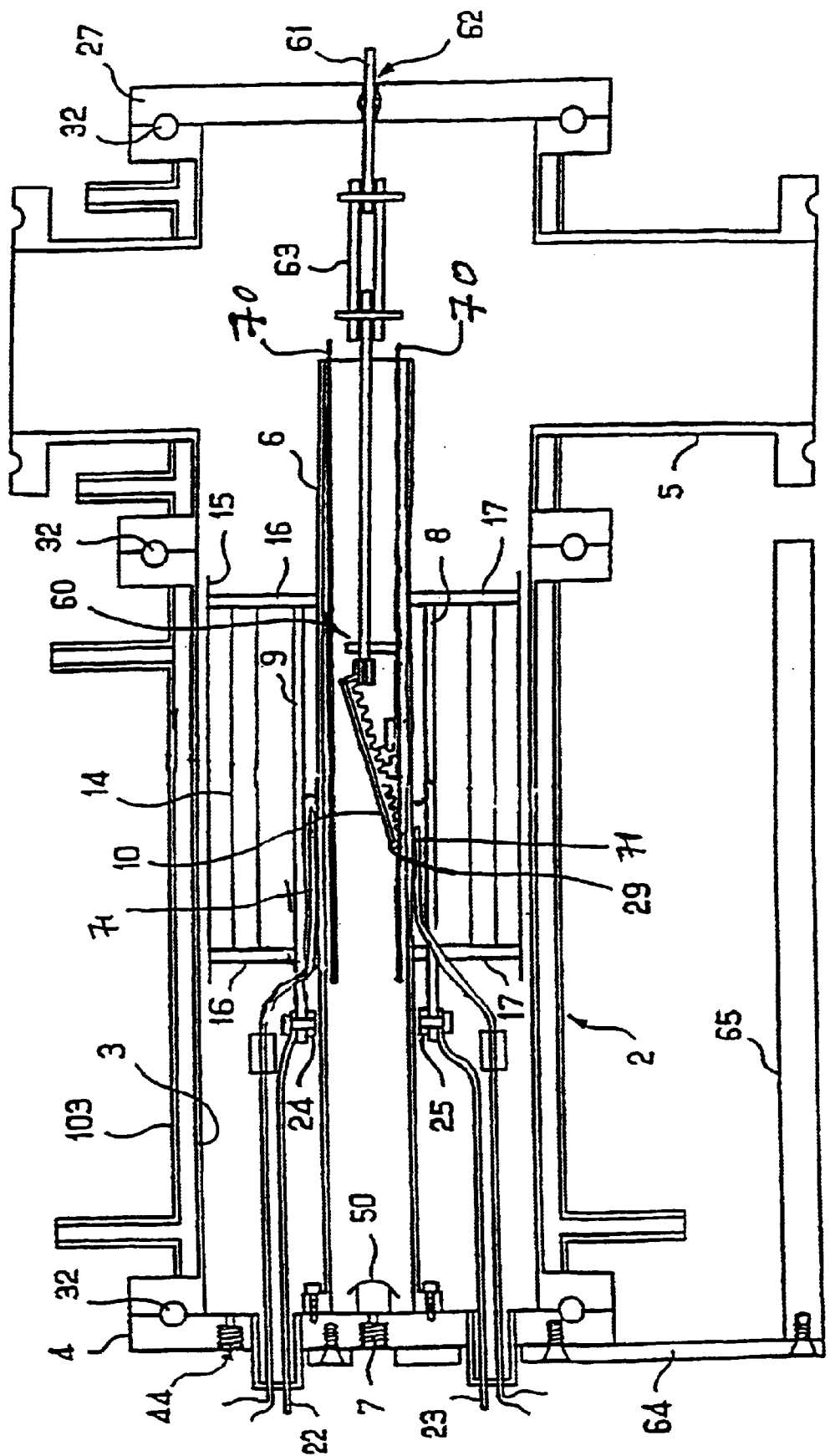
FIG. 5 is a schematic representation, in longitudinal mid-section, of yet another example of a reactor according to the present invention.

According to yet another variant, illustrated in FIG. 5, the secondary duct consists of removable plates 70 which may be easily inserted and removed by sliding in grooves, not shown, in the duct 6. These plates 70 are useful for protecting the duct 6 from the deposition away from the substrate(s) 10. They are easily maintained and advantageously made of graphite, boron nitride or another refractory material compatible with the temperature of the process and with the ambient medium.

According to another advantageous variant, also shown in FIG. 5, the temperature may be measured by optical pyrometer fibers 71 located in sheaths fastened to the duct 6 and between the duct 6 and the first 8 and second 9 heating means, rather than by thermocouples 51, so as to increase the lifetime of the means for measuring the temperature.

The process according to the invention makes it possible to achieve the aforementioned advantages while maintaining a level of impurities in the layers obtained which is equivalent to those of the layers obtained by means of the processes and the reactors of the prior art.

A process and a reactor according to the invention are particularly well suited to the growth of silicon carbide or aluminum nitride layers on substrates 10.

I claim:

1. Reactor for a chemical vapor deposition of layers of a material on at least one substrate which extends generally in a plane, comprising:

a horizontal duct made of refractory and thermal conductor material, the duct being in the form of a tube comprising an inlet opening and an outlet end facing the inlet opening, first and second means for heating an upper wall and a lower wall of the duct to a temperature substantially higher than ambient temperature, the duct absorbing the radiation omitted by the first and second heating means, the first and second means for heating each including a resistive element and an independent voltage supply, the first and second means for heating extending above and below the substrate, and outside the duct, the upper and lower surfaces of the substrate being heated by radiation of heat from at least one wall of the duct; and means to emit compounds in a gaseous form into the duct and to provide a gas flow into the duct, the duct being chemically stable with respect to the gaseous compounds and arranged in relation to the gas emitting means so that the inlet opening lies facing the gas inlet, the gas flow generally parallel to the plane of the at least one substrate from the inlet opening to the outlet end of the duct, the duct channeling the gas streams along the flow, thereby limiting any turbulence liable to disturb the growth of the layers of material on the substrate.

2. Reactor according to claim 1, wherein the duct has a rectangular cross section and includes two plates forming a lower wall and an upper wall which are horizontal and parallel to the plane of the substrate in a position that the substrate occupies during a deposition.

3. Reactor according to claim 2, wherein the first and second means for heating include a graphite strip or band placed flat and parallel to the lower wall and upper wall of the duct, in a geometry so that, in the deposition zone, a deviation from the mean temperature on a surface of the substrate is less than 3° C.

4. Reactor according to claim 2, wherein the first and second means for heating are positioned, outside the duct at a distance of 1 to 3 mm from one of the lower or upper wall.

5. Reactor according to claim 1, further comprising: at least one heat shield around the first and second means for heating.

6. Reactor according to claim 5, wherein the duct, the first and second means for heating and the at least one heat shield is placed in a tube.

7. Reactor according to claim 6, wherein the duct does not contact the tube.

8. Reactor according to claim 6, wherein the reactor is configured to pass the compounds in a gaseous form via an outlet of the duct between an internal space of the duct and a space lying between the duct and the tube, to balance pressure on at least one wall of the duct.

9. Reactor according to claim 8, wherein at least one wall of the duct have a thickness of less than or equal to one millimeter.

10. Reactor according to claim 1, wherein the first and second means for heating may be raised to different temperatures.

11. Reactor according to claim 1, wherein the first and second means for heating form only a single heating device placed all around the duct.

12. Reactor according to claim 1, wherein the first and second means for heating are placed in a region of a deposition zone.

13. Reactor according to claim 1, wherein the means for heating are supplied with a voltage of less than or equal to 230 volts.

14. Reactor according to claim 1, wherein the duct is internally lined in a first portion with a secondary duct made of refractory material.

15. Reactor according to claim 1, wherein the first and second means for heating are offset with respect to each other in a longitudinal direction of the duct.

16. Reactor according to claim 1, comprising mechanically driven means to rotate the substrate so as to ensure greater uniformity of the deposition.

17. Reactor according to claim 1, wherein the cross section of the duct is rectangular and has an internal height less than 30 mm and a width approximately equal to the width of the substrate or approximately equal to the sum of the widths of the substrates which are treated during the same deposition, the length of the duct being equal to approximately five times the diameter or the length of the largest substrate which it is desired to use or equal to approximately five times the sum of the diameters or lengths of the substrates on which a deposition may be carried out during the same operation.

18. Reactor for a chemical vapor deposition of layers of a material on at least one substrate which extends generally in a plane, comprising:

a horizontal duct made of refractory and thermal conductor material in the form of a tube comprising an inlet opening and an outlet end facing the inlet opening, the cross section of the duct being rectangular and having an internal height less than 30 mm and a width approximately equal to the width of the substrate or approximately equal to the sum of the widths of the substrates which are treated during the same deposition, the length of the duct being equal to approximately five times the diameter or the length of the largest substrate which it is desired to use or equal to approximately five times the sum of the diameters or lengths of the substrates on which a deposition may be carried out during the same operation;

first and second means for heating an upper wall and a lower wall of the duct to a temperature substantially higher than ambient temperature, the first and second means for heating each including a resistive element and an independent voltage supply, the first and second means for heating extending above and below the substrate, and outside the duct, the upper and lower surfaces of the substrate being heated by radiation of heat from at least one wall of the duct; and means to emit compounds in a gaseous form into the duct and to provide a gas flow into the duct, the duct being chemically stable with respect to the gaseous compounds arranged in relation to the gas emitting means so that the inlet opening lies facing the gas inlet, the gas flow generally parallel to the plane of the at least one substrate from the inlet opening to the outlet end of the duct, the duct channeling the gas streams along the flow, thereby limiting any turbulence liable to disturb the growth of the layers of material on the substrate.

19. Reactor according to claim 18, wherein the duct, the first and second means for heating and the at least one heat shield is placed in a tube.

20. Reactor according to claim 18, wherein the first and second means for heating are positioned, outside the duct at a distance of 1 to 3 mm from one of the lower or upper wall.

21. Reactor according to claim 18, comprising mechanically driven means to rotate the substrate so as to ensure greater uniformity of the deposition.

* * * * *